United States Patent [19]

Kerr et al.

[11] Patent Number: 5,136,355
[45] Date of Patent: Aug. 4, 1992

[54] INTERCONNECTING LAYER ON A SEMICONDUCTOR SUBSTRATE

[75] Inventors: John A. Kerr; Ian F. Deviny, both of Lincoln, England

[73] Assignee: Marconi Electronic Devices Limited, England

[21] Appl. No.: 665,290

[22] Filed: Mar. 6, 1991

Related U.S. Application Data

[63] Continuation of Ser. No. 270,258, Nov. 14, 1988, abandoned.

[30] Foreign Application Priority Data

Nov. 25, 1987 [GB] United Kingdom ............... 8727612

[51] Int. Cl.⁵ .................................. H01L 27/02
[52] U.S. Cl. ........................ 357/41; 357/42; 357/45; 357/67; 357/71
[58] Field of Search ............ 357/68, 40, 43, 45, 357/41, 71 S, 42, 67 S

[56] References Cited

U.S. PATENT DOCUMENTS

| | | | |
|---|---|---|---|
| 4,628,340 | 12/1986 | Hashimoto | 357/42 |
| 4,689,653 | 8/1987 | Miyazaki | 357/41 |
| 4,701,777 | 10/1987 | Takayama et al. | 357/43 |
| 4,829,359 | 5/1989 | O et al. | 357/42 |
| 4,905,073 | 2/1990 | Chen et al. | 357/42 |
| 4,951,114 | 8/1990 | Lewis et al. | 357/42 |
| 4,989,062 | 1/1991 | Takahashi et al. | 357/45 |

FOREIGN PATENT DOCUMENTS

| | | | |
|---|---|---|---|
| 57-162360 | 10/1982 | Japan | 357/42 |
| 58-182862 | 10/1983 | Japan | 357/42 |
| 60-120571 | 6/1985 | Japan | 357/40 |
| 60-160650 | 8/1985 | Japan | 357/42 |
| 61-264751 | 11/1986 | Japan | 357/42 |
| 63-114160 | 5/1988 | Japan | 357/42 |

*Primary Examiner*—William Mintel
*Assistant Examiner*—Minhloan Tran
*Attorney, Agent, or Firm*—Kirschstein, Ottinger, Israel & Schiffmiller

[57] ABSTRACT

A semiconductor arrangement includes a substrate having a plurality of transistors formed therein and a tungsten layer thereon in the form of elongate tracks serving to interconnect the transistors. Localized regions of highly doped semiconductor material underlie the tracks and form an ohmic contact therewith. The tungsten layer is overlaid with an electrically insulating oxide on which further electrical interconnections are present.

3 Claims, 3 Drawing Sheets

INTERCONNECTING LAYER ON A SEMICONDUCTOR SUBSTRATE

This is a continuation of application Ser. No. 07/270,258 filed Nov. 14, 1988, now abandoned.

BACKGROUND OF THE INVENTION

1. Field of the Invention

This invention relates to a semiconductor arrangement in which a plurality of transistors are formed in or on a common semiconductor substrate.

Description of Related Art

It is becoming common to form semiconductor devices having a large array of active switching or storage elements each of which generally has to be connected to at least one power supply rail and an input and/or output signal path. It can be difficult to accommodate such a large number of electrically conductive paths on the surface of a semiconductor substrate, and it may be necessary to form a multilayer structure having conductive interconnections overlying each other and being spaced apart by insulation material. Such an arrangement can be complex and expensive to make, and the electrical properties of the interconnections may not be sufficiently good for very high frequency operation.

SUMMARY OF THE INVENTION

According to this invention a semiconductor arrangement includes a semiconductor substrate having a plurality of transistors formed therein; and a layer of tungsten on the substrate in the form of elongate tracks in contact with the semiconductor material over a major portion of their lengths and serving to interconnect a plurality of the transistors, localised regions of highly doped semiconductor material underlying said conductive tracks so as to form an ohmic contact therewith, and the layer of tungsten being overlaid with an electrically insulating oxide on which further electrical interconnections are present.

BRIEF DESCRIPTION OF THE DRAWINGS

The invention is further described by way of example with reference to the accompanying drawings in which.

DETAILED DESCRIPTION OF THE PREFERRED EMBODIMENTS

Figure 1:
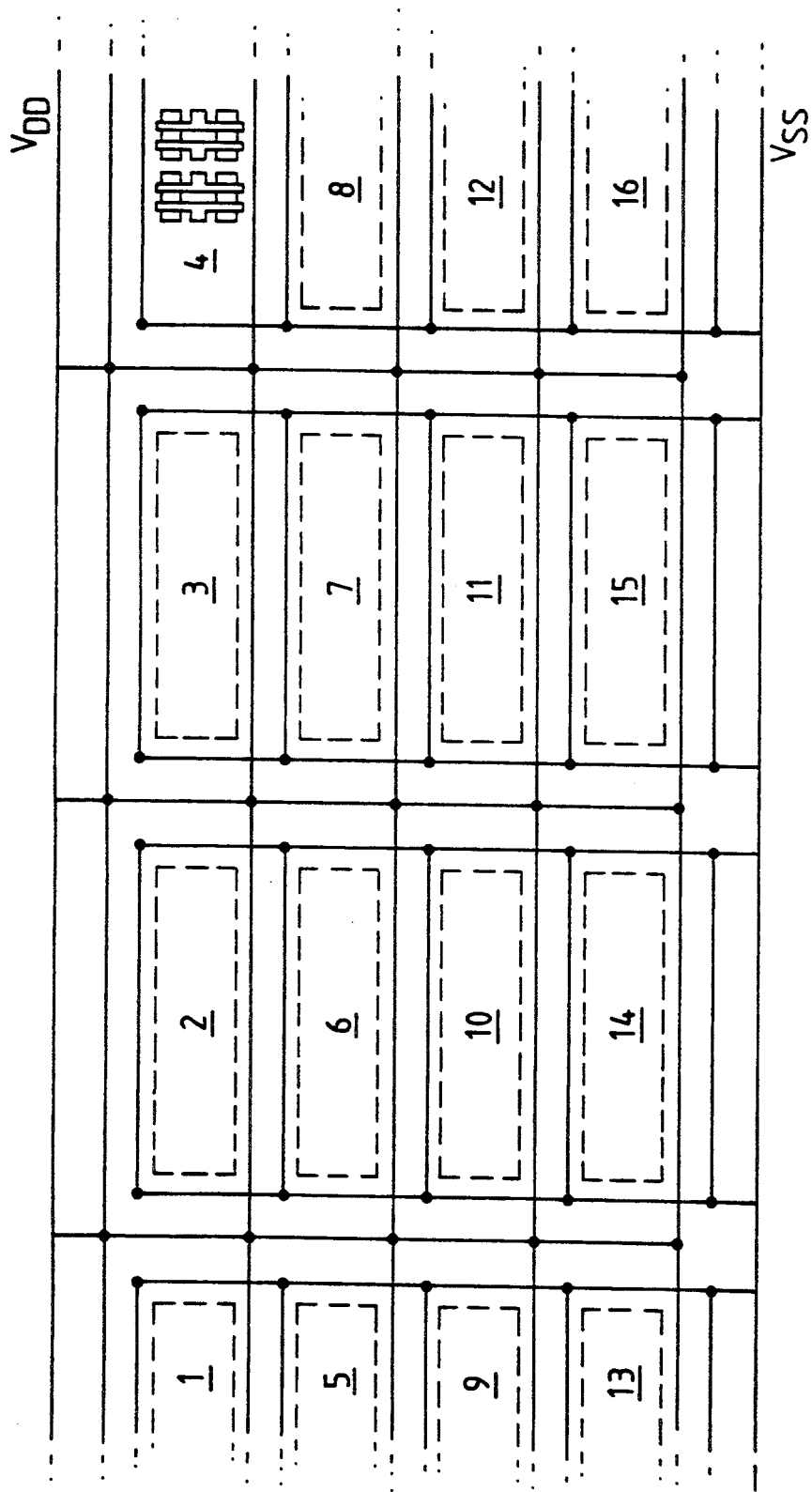
FIG. 1 shows in diagrammatic form a large array of transistors formed on a common substrate.

Referring to FIG. 1, there is shown therein a semiconductor arrangement in which a large area substrate of silicon is provided, with an array of many transistors arranged in a pattern of individual groups 1 to 16 of which the layout is shown for only group 4, the others being indicated symbolically. Each group consists of many field effect transistors, and requires the provision of two power supply rails $V_{DD}$ 17, and $V_{SS}$ 18 as well as individual input and output connections (not shown) for each transistor or pair of transistors depending on the function required. If all of these electrical connections were laid in a single layer over the surface of the semiconductor substrate it would be difficult to accommodate them, and even so would require the use of complex and inconvenient routing patterns, as well as encroaching on those areas of the substrate which could otherwise be occupied by transistors.

The power supply rails 17, 18 are constituted by a thin layer of tungsten in contact with the semiconductor surface itself. It will be appreciated that conductive metal tracks are usually and conventionally formed over an intermediate layer of electrically insulating oxide or the like which serves to space the track away from the semiconductor material, with windows being formed locally in the insulating layer at those locations at which an electrical connection is required. In the present invention the elongate tracks of tungsten are formed in contact with the semiconductor material itself over at least the major part of their lengths. In order to produce a good low resistance contact between the tungsten tracks and the semiconductor material, locally doped regions of high conductivity silicon are produced immediately under the tungsten tracks. This has the effect of producing ohmic contacts and avoiding the formation of unwanted barrier diodes (e.g. Schottky diodes) at the interface between the two materials, and by the presence of the resulting low resistance ohmic connection it is assured that the substrates do not electrically 'float' but are instead held at the potential of the appropriate power supply rail.

Figure 2:
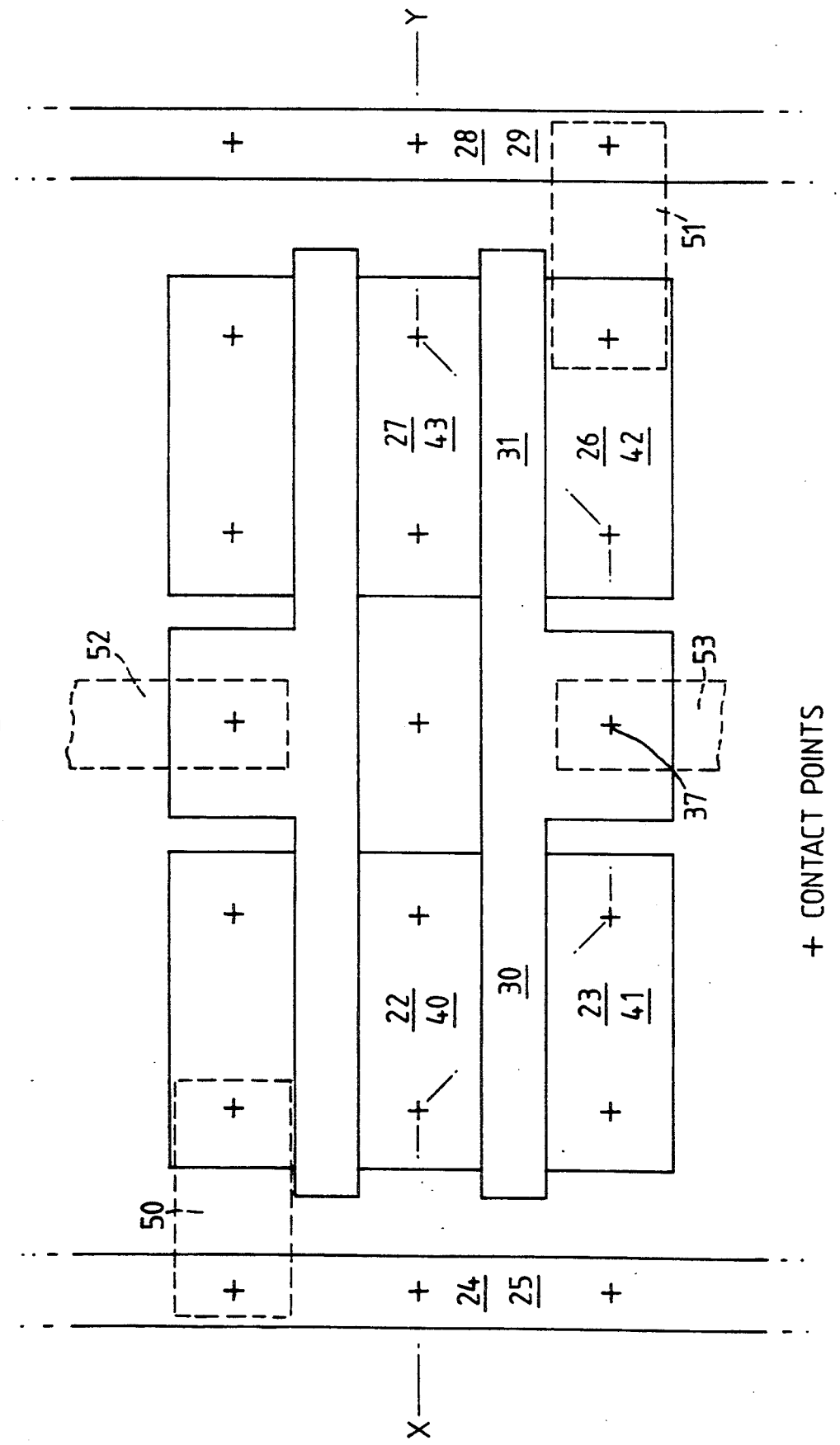
FIG. 2 shows an individual group of transistors in more detail.
Figure 3:
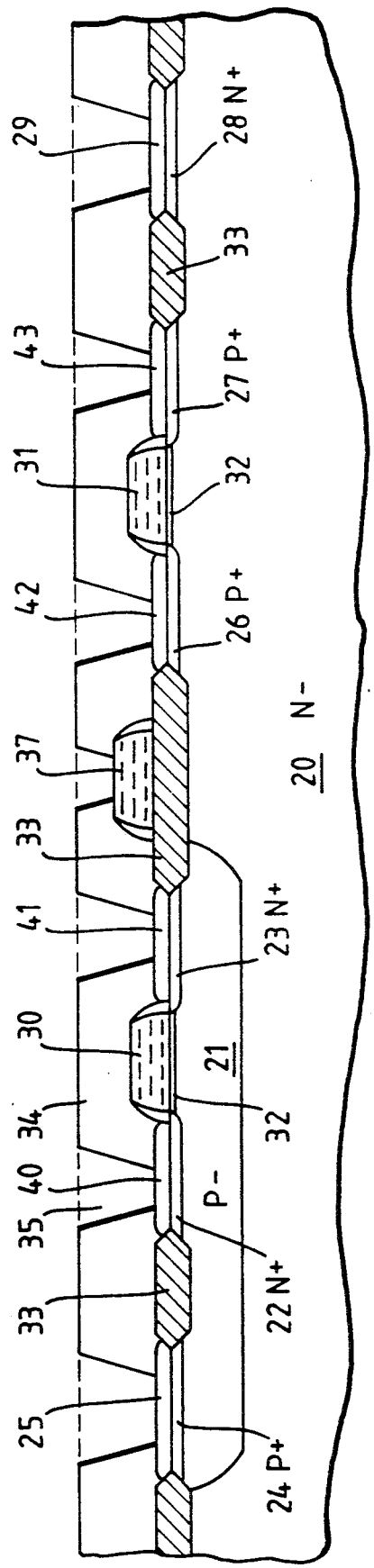
FIG. 3 shows a sectional view of FIG. 2, taken on the line XY.

The group 4 of transistors is shown in more detail in FIGS. 2 and 3. Each transistor is a field effect device consisting in the usual manner of source and drain regions linked by a channel region, the conductivity of which is determined by the potential in a gate electrode which is spaced apart from the channel region at the surface of the silicon substrate by an intervening layer of electrically insulating silicon oxide. In this example the gate electrode is composed of polysilicon which is doped to render it fairly highly conductive.

As can be seen from FIG. 3, the silicon substrate 20 is basically of n-type, but with a p-type well 21 of silicon set into it, so as to allow the fabrication of complementary p and n channel transistors. In FIG. 3, the two n+ regions 22, 23 in the p-type well 21 constitute the source and drain of one transistor, with the p+ region 24 representing the area over which a power supply rail 25 of tungsten is located. Localised regions 40, 41 of tungsten are formed in contact with the source and drain 22, 23 so as to constitute a low resistance electrical contact therewith. A complementary transistor consists of source and drain regions 26, 27 of p+ silicon, and an adjacent n+ region 28 underlies a power supply rail 29 of tungsten. Similarly, localised regions 42, 43 of tungsten are in contact with the source and drains 26, 27. As the power supply rail 25 is located in the p well 21 it is electrically isolated from the other power supply rail 29.

The polysilicon gates 30, 31 are positioned over thin layers 32 of oxide. Thicker regions 33 of silicon oxide, termed a field oxide, serve to separate the two transistors and the power supply rails at the surface of the silicon substrate, and an even thicker layer 34 of oxide is provided over the whole of the semiconductor arrangement with localised windows 35 being formed therein to permit electrical connection to be made to selected regions of a metal overlay which serve to link the power supply rails to the source and drain. It will be seen from FIG. 2 that the gates of each pair of complementary transistors are connected together so that a single contact point 37 can be used to link to an input signal path formed as a long track over the top surface of the thick oxide. As the power supply rails are covered by this thick oxide, the layout of the signal tracks is not thereby constrained, allowing the use of complex interconnection patterns which do not occupy space on the silicon substrate which can be utilised for transistors.

The tungsten layer is typically between 1000 Å and 2000 Å thick, and has a resistivity of about 1 ohm per square. This compares with a resistivity of about 20 ohm per square for the p+ and n+ doped regions of the silicon. Thus the tungsten has a sufficiently low resistance to be used as relatively long tracks over the surface of the semiconductor substrate, without the need to provide the conventional long interconnections of aluminium or gold over a thick layer of oxide.

The tungsten is deposited by passing tungsten hexafluoride gas ($WF_6$) over the silicon substrate in which the windows 35 have previously been opened in the thick oxide 34. The gas is at low pressure (i.e. less than atmospheric pressure) at a temperature of about 600° C. The gas decomposes and tungsten is deposited onto the exposed silicon. It does not adhere to the oxide, and the deposition process ceases when the layer reaches a thickness of up to 2000 Å, although typically the thickness of the tungsten layer so formed is about 1000 Å.

The field effect transistors are linked as necessary to the power supply rails 25, 29 by short aluminium links, two links 50, 51 of which are illustrated in FIG. 2 by way of example. These links are formed over the thick oxide 34, and make contact with the tungsten areas via the windows 35 in the oxide. Additional links are provided as required. The input/output tracks are also formed of aluminium lying over the thick oxide 34, and because the upper surface of this oxide is not used to carry the long power supply tracks, this surface is available on which to place a relatively complex and extensive pattern of input/output tracks. Two such aluminium input tracks 52, 53 are shown connected to respective common gate electrodes of the field effect transistors.

We claim:

1. A semiconductor arrangement in which a plurality of field effect transistors are formed as an array on a semiconductor substrate, and at least one elongate power supply rail is formed on said semiconductor substrate so as to extend adjacent said array of transistors, comprising:
   a semiconductor substrate which is doped to be of a given conductivity type;
   a plurality of first regions in said substrate which are doped to be of opposite conductivity type to said given conductivity type to form respective source regions of said plurality of field effect transistors;
   a plurality of second regions in said substrate which are doped to be of said opposite conductivity type to form respective drain regions of said plurality of field effect transistors;
   an elongate third region in said substrate of which at least parts are heavily doped to be of said given conductivity type, which third region defines the extent of said at least one elongate power supply rail;
   said first, second and third regions extending into said semiconductor substrate from a surface thereof;
   each of said first, second and third regions being provided at said surface with a respective layer of tungsten deposited on said surface of said semiconductor substrate, the layer of tungsten over said third region constituting said at least one elongate power supply rail;
   an electrically insulating layer formed over said layers of tungsten, said insulating layer having provided therein a plurality of apertures through which at least one electrical connection may be made to each of said respective layers of tungsten; and
   at least one electrically conductive interconnecting layer formed over said insulating layer between two of said apertures so as electrically to interconnect the respective layers of tungsten of a region of a respective one of said transistors and said power supply rail.

2. A semiconductor arrangement as claimed in claim 1, wherein the semiconductor substrate is of silicon.

3. A semiconductor arrangement as claimed in claim 1, wherein the electrically insulating layer is an oxide layer.

* * * * *